United States Patent
Kim

(10) Patent No.: US 6,170,076 B1
(45) Date of Patent: Jan. 2, 2001

(54) SYSTEMATIC PUNCTURED CONVOLUTIONAL ENCODING METHOD

(75) Inventor: Min-Goo Kim, Suwon-shi (KR)

(73) Assignee: Samsung Electronics Co., Ltd. (KR)

( * ) Notice: Under 35 U.S.C. 154(b), the term of this patent shall be extended for 0 days.

(21) Appl. No.: 09/104,659

(22) Filed: Jun. 25, 1998

(30) Foreign Application Priority Data

Jun. 25, 1997 (KR) .................................................. 97-27070

(51) Int. Cl.$^7$ .......................... H03M 13/03; H03M 13/00
(52) U.S. Cl. .......................... 714/786; 714/756; 714/790; 714/781
(58) Field of Search .................................. 714/786, 756, 714/701, 746, 790, 781

(56) References Cited

U.S. PATENT DOCUMENTS

| | | | |
|---|---|---|---|
| 4,312,070 | * 1/1982 | Coombes et al. | 714/762 |
| 4,547,887 | 10/1985 | Mui | 375/200 |
| 5,042,033 | 8/1991 | Costa | 714/701 |
| 5,396,518 | 3/1995 | How | 375/225 |
| 5,408,502 | 4/1995 | How | 375/340 |
| 5,438,590 | 8/1995 | Tzukerman et el. | 375/259 |
| 5,446,747 | 8/1995 | Berrou | 714/788 |
| 5,465,267 | 11/1995 | Todoroki | 375/279 |
| 5,473,601 | 12/1995 | Rosen et al. | 370/319 |
| 5,473,727 | 12/1995 | Nishguchi et al. | 704/222 |
| 5,486,825 | 1/1996 | Cole | 340/50 |
| 5,497,401 | 3/1996 | Ramaswamy et al. | 375/341 |
| 5,511,082 | 4/1996 | How et al. | 714/790 |
| 5,535,220 | 7/1996 | Kanno et al. | 714/701 |
| 5,537,420 | 7/1996 | Huang | 714/701 |
| 5,572,532 | 11/1996 | Fimoff et al. | 714/702 |
| 5,592,492 | 1/1997 | Ben-Effraim et al. | 714/702 |
| 5,610,908 | 3/1997 | Shelswell et al. | . |
| 5,621,761 | 4/1997 | Heegard | . |
| 5,627,538 | 5/1997 | Ferry | . |
| 5,633,881 | 5/1997 | Zehavi et al. | . |
| 5,668,820 | 9/1997 | Ramesh et al. | . |
| 5,719,875 | 2/1998 | Wei | . |
| 5,721,745 | 2/1998 | Hladik et al. | . |
| 5,734,962 | 3/1998 | Hladik et al. | . |
| 5,742,622 | 4/1998 | Claydon et al. | . |
| 5,745,497 | 4/1998 | Ben-Effraim et al. | . |
| 5,996,104 | * 11/1999 | Herzberg | 714/755 |

OTHER PUBLICATIONS

Min–Goo Kim, "On Systematic Punctured Convolutional Codes", IEEE Transactions On Communications, vol. 45, No. 2, Feb. 1997, pp. 133, 135, 137, & 139.

* cited by examiner

Primary Examiner—Trinh L. Tu
(74) Attorney, Agent, or Firm—Dilworth & Barrese, LLP

(57) ABSTRACT

A rate-l/n or rate-k/n convolutional encoding method, in a digital communications system having a non-systematic convolutional encoder, includes the steps of: obtaining first to n-th block code words by multiplying first to n convolutional code generating polynomials by an information polynomial upon input of an information word; converting one of the first to n-th block code words to a systematic code word and obtaining a new information word corresponding to the systematic code word; and generating a convolutional code by encoding the new information code in the non-systematic convolutional encoder.

14 Claims, 5 Drawing Sheets

| Original codes | | | | A | $d_{free}$ | | Punctured convolutional codes $a_d, C_{1d}, C_{2d}, d=d_{free}, d_{free}+1, ...$ |
|---|---|---|---|---|---|---|---|
| K | $G_1$ | $G_2$ | $d_{free}$ | | | | |
| 3 | 101 | 111 | 5 | $\begin{bmatrix} 1 & 0 \\ 1 & 1 \end{bmatrix}$ | 3 | $a_d$ | 1,4,14,40,115,331,953,2744,7901,22570,65506 |
|   |     |     |   |   |   | $C_d$ | 1,10,54,226,853,3038,10423,34836,114197,368814,1177124 |
|   |     |     |   |   |   | $C_{2d}$ | 3,10,44,154,521,1724,5609,18008,57201,180106,562944 |
|   |     |     |   |   |   | $C_d-\epsilon_{2d}$ | -2,0,10,72,332,1314,4814,16828,56996,188708,614180 |
| 4 | 1101 | 1111 | 6 | $\begin{bmatrix} 1 & 1 \\ 0 & 1 \end{bmatrix}$ | 4 | $a_d$ | 3,11,35,114,378,1253,4147,13725,45428,150362 |
|   |      |      |   |   |   | $C_d$ | 10,43,200,826,3314,12857,48834,182373,672324,2452626 |
|   |      |      |   |   |   | $C_{1d}$ | 10,33,146,538,2046,7595,27914,101509,366222,1312170 |
|   |      |      |   |   |   | $C_d-\epsilon_{1d}$ | 0,10,54,288,1268,5262,20920,80864,306102,1140456 |
| 5 | 10011 | 11101 | 7 | $\begin{bmatrix} 1 & 1 \\ 0 & 1 \end{bmatrix}$ | 4 | $a_d$ | 1,0,27,0,345,0,4515,0,59058,0,772627 |
|   |       |       |   |   |   | $C_d$ | 1,0,124,0,2721,0,50659,0,858436,0,13793381 |
|   |       |       |   |   |   | $C_{2d}$ | 3,0,106,1841,0,30027,0,471718,0,7201171 |
|   |       |       |   |   |   | $C_d-\epsilon_{2d}$ | -2,0,18,0,880,0,20632,0,386718,0,6592210 |
| 6 | 101011 | 111101 | 8 | $\begin{bmatrix} 1 & 0 \\ 1 & 1 \end{bmatrix}$ | 6 | $a_d$ | 19,0,220,0,3089,0,42725,0,586592 |
|   |        |        |   |   |   | $C_d$ | 96,0,1904,0,35936,0,637895,0,10640725 |
|   |        |        |   |   |   | $C_{2d}$ | 82,0,1260,0,21530,0,354931,0,5643947 |
|   |        |        |   |   |   | $C_d-\epsilon_{2d}$ | 14,0,644,0,14406,0,282964,0,4996778 |
| 7 | 1011011 | 1111001 | 10 | $\begin{bmatrix} 1 & 1 \\ 1 & 0 \end{bmatrix}$ | 6 | $a_d$ | 1,16,48,158,642,2435,9174,34701,131533 |
|   |         |         |    |   |   | $C_d$ | 3,70,285,1276,6160,27128,117019,498835,2103480 |
|   |         |         |    |   |   | $C_{1d}$ | 3,76,269,960,4290,18034,74197,303431,1237276 |
|   |         |         |    |   |   | $C_d-\epsilon_{1d}$ | 0,-6,16,316,1870,9094,42822,195404,866204 |

| P | R | A | $d_{free}$ | | $a_d, c_d, c_{1d}, c_{2d}, d=d_{free}, d_{free}+1, \ldots$ |
|---|---|---|---|---|---|
| 3 | 3/4 | $\begin{bmatrix}1 & 1 & 0\\1 & 0 & 1\end{bmatrix}$* | 5 | $a_d$ | 8,31,160,892,4512,23297,120976,624304,3229885 |
| | | | | $c_d$ | 42,201,1492,10469,62935,379546,2252394,13064540,75080312 |
| | | | | $c_{1d}$ | 46,203,1256,8301,4752,274684,1582618,8968812,50521152 |
| | | | | $c_{2d}$ | 44,217,1274,8123,47151,273196,1570834,8893944,50090788 |
| 4 | 4/5 | $\begin{bmatrix}1 & 0 & 0\\1 & 1 & 1\end{bmatrix}$ | 4 | $a_d$ | 1,1357,3051,799,11285,66808,369683,2034199 |
| | | | | $c_d$ | 6,81,529,3665,38853,373629,266595,16317929,97534896 |
| | | | | $c_{1d}$ | 2,49,263,1631,10861,76641,506269,3076011,18398116 |
| 4 | 4/5 | $\begin{bmatrix}1 & 1 & 1 & 1\\1 & 0 & 0 & 0\end{bmatrix}$* | 4 | $a_d$ | 3,24,172,1158,7408,48706,319563,2094852 |
| | | | | $c_d$ | 12,188,1732,15256,121367,945395,7167584,53348320 |
| | | | | $c_{1d}$ | 10,96,848,6552,47789,355697,2575710,18559164 |
| 4 | 5/6 | $\begin{bmatrix}1 & 1 & 0 & 1\\1 & 0 & 1 & 0\end{bmatrix}$ | 4 | $a_d$ | 14,69,654,4996,39677,314975,2503576,19875546 |
| | | | | $c_d$ | 92,528,8694,79453,791795,7369828,67809344,609896384 |
| | | | | $c_{1d}$ | 88,508,6514,57913,541275,4893312,43802868,386252736 |
| | | | | $c_{2d}$ | 86,502,6678,58497,553047,4992962,44803140,395367552 |
| 5 | 5/6 | $\begin{bmatrix}1 & 1 & 1 & 1\\1 & 0 & 0 & 0\end{bmatrix}$ | 3 | $a_d$ | 1,17,136,1143,8717,69488,550980,4362319 |
| | | | | $c_d$ | 3,187,1797,19202,180275,1703292,15555517,139587840 |
| | | | | $c_{1d}$ | 3,61,591,5900,52293,474356,4213541,36953476 |
| 6 | 6/7 | $\begin{bmatrix}1 & 1 & 0 & 1 & 0\\1 & 0 & 0 & 1 & 1\end{bmatrix}$* | 3 | $a_d$ | 1,20,223,1961,18084,168982,1573256,14620204 |
| | | | | $c_d$ | 5,169,2725,32233,370771,4166922,45364312,482335968 |
| | | | | $c_{1d}$ | 5,149,1923,21239,231225,2502704,26506364,275916512 |
| | | | | $c_{2d}$ | 7,163,2261,25365,279653,3048893,43248123,6339725024 |
| 6 | 6/7 | $\begin{bmatrix}1 & 1 & 1 & 1 & 1\\1 & 0 & 0 & 0 & 0\end{bmatrix}$ | 3 | $a_d$ | 2,32,310,2767,25617,235749,2170952,19982804 |
| | | | | $c_d$ | 10,349,4165,49523,567541,6194830,66146896,692511040 |
| | | | | $c_{1d}$ | 6,115,1385,14653,153453,1650726,17044626,173880864 |
| 7 | 7/8 | $\begin{bmatrix}1 & 1 & 1 & 0 & 1 & 0\\1 & 0 & 0 & 1 & 0 & 1\end{bmatrix}$* | 3 | $a_d$ | 2,46,499,5291,56137,598557,6371293,67889504 |
| | | | | $c_d$ | 9,500,7437,105707,1402089,17880044,221889248,2699950080 |
| | | | | $c_{1d}$ | 7,310,4329,56939,721833,8917389,108152008,1292733952 |
| | | | | $c_{2d}$ | 15,464,6265,83887,1072601,13344173,162427392,1948489984 |
| 7 | 7/8 | $\begin{bmatrix}1 & 1 & 1 & 1 & 1 & 1\\1 & 0 & 0 & 0 & 0 & 0\end{bmatrix}$ | 3 | $a_d$ | 2,42,468,4939,52778,567778,6073705 |
| | | | | $c_d$ | 14,389,6792,97243,1317172,17162804,215514752 |
| | | | | $c_{1d}$ | 6,149,2084,26181,326066,4000330,48097368 |
| 15 | 15/16 | $\begin{bmatrix}1 & 1 & 1 & 1 & \ldots & 1 & 1\\1 & 0 & 0 & 0 & \ldots & 0 & 0\end{bmatrix}$ | 2 | $a_d$ | 1,77,1643,34183,671175,12395688 |
| | | | | $c_d$ | 32,1633,49139,1308072,30390642,630285696 |
| | | | | $c_{1d}$ | 2,229,6329,163338,3833694,82358328 |

SYSTEMATIC PUNCTURED CONVOLUTIONAL ENCODING METHOD

BACKGROUND OF THE INVENTION

1. Field of the Invention

The present invention relates to an error correction encoding method in a digital communications system and, more particularly, to a systematic punctured convolutional encoding method.

2. Description of the Related Art

Error correction is an important feature for a digital modem and many error correction techniques have been suggested. For instance, the use of convolutional codes as error correction codes is widespread in mobile radio communications systems and has been adopted as a standard for an air interface in a CDMA (Code Division Multiple Access) digital cellular system, IS-95.

It is to be appreciated that a code rate, R, of 1/2 (i.e., k/n where k is number of bits in an information symbol and n is the number of bits in the code symbol) associated with a convolutional code is non-systematic, and a first code word $c_1(x)$ and a second code word $c_2(x)$ are generated from an input information word $i(x)$, respectively, by:

$$c_1(x) = g_1(x)i(x) \quad (1)$$

$$c_2(x) = g_2(x)i(x) \quad (2)$$

where $g_1(x)$ and $g_2(x)$ represent the code word generating polynomials, where the code words $c_1(x)$ and $c_2(x)$ are non-systematic, and where the information word $i(x)$, which is not independent of the code words, can be obtained only by an associated decoder. That is, unlike systematic codes, the k bits comprising the information word $i(x)$ do not typically remain unaltered in a non-systematic code word.

A punctured convolutional code having a code rate larger than 1/2 can be obtained by periodically puncturing the code words $c_1(x)$ and $c_2(x)$ generated from equations (1) and (2), using a puncturing matrix A. It is to be further appreciated that a variety of forms of the puncturing matrix are well known in the field. Since the puncturing matrix A is a non-systematic matrix, it follows that the code words generated by use of this matrix are non-systematic punctured convolutional codes.

FIG. 1 is a block diagram of a conventional encoder and decoder of a rate-5/8 punctured convolutional code. Reference character A indicates a puncturing matrix [11101 10111]. It is to be understood that an information word is convolutionally coded by convolutional encoder 11 having a code rate of 1/2. That is, for every 1-bit information word, a 2-bit convolutional code word is generated. Next, to increase the code rate of the transmission encoding process, the convolutional code word is passed through a puncturer 12 having a deleting pattern or puncturing matrix associated therewith. The matrix A results in a punctured code rate of 5/8. That is for every 5-bits input to convolutional encoder 11, 8-bits are output from the puncturer 12. The punctured convolutional code word is then transmitted over the communications channel to a receiver which reverses the coding process. That is, the code word is passed through an erasure insertion device or depuncturer 13 which restores deleted bits in correspondence with the puncturing matrix employed in the encoding process. Then, the depunctured word is passed through a convolutional code decoder 14 having a rate of 1/2 which outputs the information word originally input to encoder 11.

Conventional punctured convolutional codes are not available for a system requiring a systematic data structure because they are all generated from non-systematic puncturing matrices. With data and frames in systematic forms, much of the processing delay can be reduced in a transmission system employing an error corrector and detector which uses CRC (Cyclic Redundancy Check) for error detection. For example, to obtain a transmitted information word from a code word prior to decoding in the case of a current non-systematic convolutional code, a divider is required to divide the received code word by the code word generating polynomial g(x). This divider is composed of linear feedback shift registers (LFSRs), the number of LFSRs being equivalent to the order of the error correction code generating polynomial for the CRC code employed. In addition, the processing delays and operations associated with the detection of the information word from the received code word is a function of the size of the code word transmitted. Hence, processing delay increases with code word size, that is, frame size. It is to be appreciated that frames are large in applications involving high multispeed hard disk drivers or high speed data transmission systems such as, for example, ISDN (Integrated Services Digital Network). In other words, due to a high transmission rate within a very short time, a single frame has many bits or symbols, which implies that a large amount of time is required to obtain an information word. This adds to processing delay-related difficulties since it takes a long time to implement decoding in a conventional Viterbi decoder. It is well known that delay-incurred problems are not negligible in a communications system.

SUMMARY OF THE INVENTION

An object of the present invention is to provide a systematic punctured convolutional encoding method in which a non-systematic code word is converted to a systematic code word.

To achieve the above and other objects, there is provided a rate-l/n convolutional encoding method in a digital communication system having a non-systematic convolutional encoder. In the method, first to n-th block code words are obtained by multiplying first to n convolutional code generating polynomials by an information polynomial upon input of an information word, one of the first to n-th block code words is converted to a systematic code word, and a new information word corresponding to the systematic code word is obtained. Then, a convolutional code is generated by encoding the new information code in the non-systematic convolutional encoder. The resulting code word is then preferably processed by a systematic puncturer.

These and other objects, features and advantages of the present invention will become apparent from the following detailed description of illustrative embodiments thereof, which is to be read in connection with the accompanying drawings in which the same reference numerals are used throughout the various figures to designate same or similar components.

BRIEF DESCRIPTION OF THE DRAWINGS

FIG. 7 is a table illustrating weight spectra of rate-2/3 systematic punctured convolutional codes generated from a known code with a code rate of 1/2, $3 \leq K \leq 7$, P of 2; and FIG. 8 is a table illustrating weight spectra of systematic punctured convolutional codes generated from a known code with a code with a code rate of 1/2, K of 7, $G_1$=[1011011], and $G_2$=[1111001].

DETAILED DESCRIPTION OF PREFERRED EMBODIMENTS

Due to the fact that every linear code has different sets of code words, and each code word in one set corresponds to a code in another set with the same code weight spectrum, in accordance with the present invention, a systematic code word is matched one by one with a corresponding code word so that systematic code words having the same code weight spectra as those of non-systematic convolutional or punctured convolutional code words are obtained. A detailed description of a method of the invention will now follow.

1. Rate-1/2 convolutional code

It is to be understood that a rate-1/2 convolutional code can be interpreted as equivalent to an interleaved linear block code.

Figure 1:
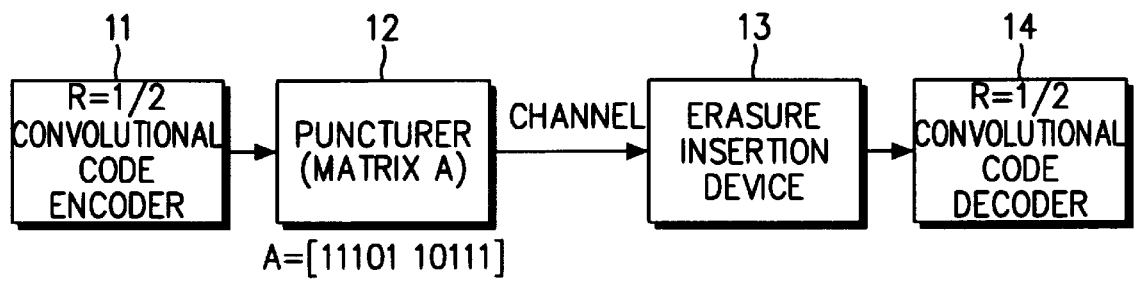
FIG. 1 is a block diagram of a conventional encoder and decoder of a rate-5/8 punctured convolutional code.
Figure 2:
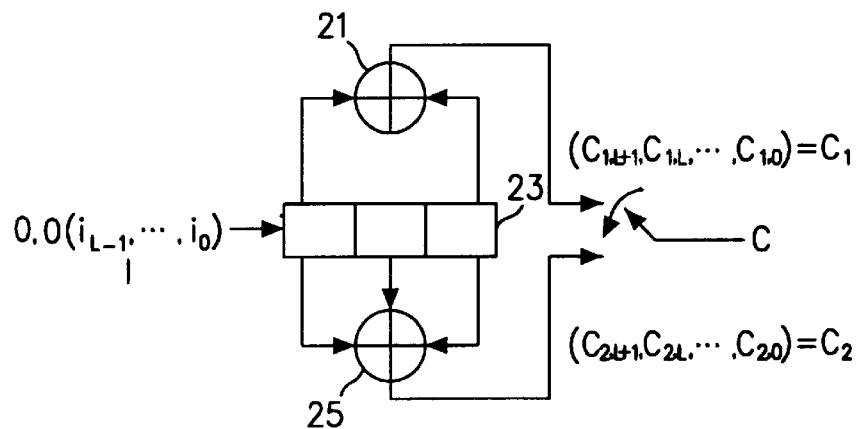
FIG. 2 is a schematic view of an encoder of a rate-1/2 non-systematic convolutional code.

FIG. 2 is a schematic view of a convolutional code encoder with a code rate of 1/2 and a constraint length (K) of 3. Reference numerals 21 and 25 are modulo-2 adders and reference numeral 23 denotes a shift register. As shown, the rate 1/2 convolutional code encoder sequentially receives an information word I into shift register 23. Shift register 23 has 3 binary stages (K=3) with the first and last stages connected to modulo-2 adder 21 and all three stages connected to modulo-2 adder 25. As a result, code word $C_1$ is output from adder 21 and code word $C_2$ is output from adder 25. Code word C may be considered as code word C interleaved with code word $C_2$.

Figure 3:
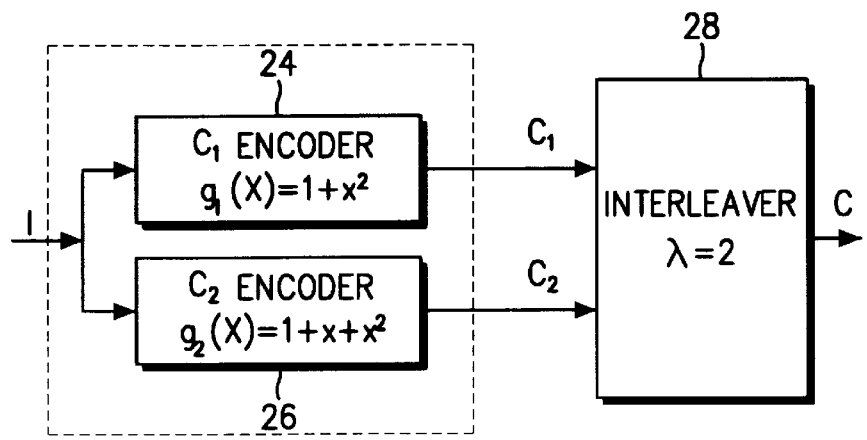
FIG. 3 is a conceptual view of a systematic convolutional encoder according to the present invention.

FIG. 3 is a conceptual view of a systematic convolutional encoder on the basis of the above interpretation. The encoder includes a $C_1$ encoder 24 and a $C_2$ encoder 26 for obtaining first and second block code words $C_1$ and $C_2$ by multiplying an input information word I by first and second convolutional code generating polynomials $g_1(x)$ and $g_2(x)$, respectively, and an interleaver 28 for generating a convolutional code word C by interleaving the first and second code words $C_1$ and $C_2$ with an interleaving depth ($\lambda$) of 2.

The basis for interpreting a rate-1/2 convolutional code as an interleaved linear block code is as follows. Assuming that a general convolutional code generating polynomial is $g_k(x)$ (k=1, 2, ..., R) and an information word polynomial is I(x), a code word $C_k(x)$ (k=1, 2, ..., R) can be expressed as:

$$C_1(x)=g_1(x)I(x) \quad (3)$$

$$C_k(x)=g_k(x)I(x) \quad (4)$$

It is to be appreciated that if each code word is considered a code word of a frame unit using zero-tail biting for block coding of a convolutional code, that is, a block code, each code word is equivalent to a linear block code. Thus, code words are generated from the code generating polynomials $g_k(x)$ (k=1, 2, ..., R), and a code word C is obtained by interleaving these code words. All the code words are non-systematic.

2. Rate-1/n systematic punctured convolutional code

Every linear block code has a set of systematic code words associated therewith. Therefore, one code word is selected from R code words and converted to a systematic code word. Then, a new information word corresponding to this systematic code word is input to a conventional non-systematic convolutional encoder. One of the codewords output from the encoder includes the first input information word. Thus, in accordance with the invention, a systematic convolutional code can be generated from a non-systematic code word.

3. Rate-k/n systematic punctured convolutional code

Puncturing is implemented to obtain a high-rate convolutional code using the systematic convolutional encoder realized in the above step. Since it is important to retain a systematic code word, symbols of a code word selected as the systematic code word should typically be transmitted without puncturing. Nonetheless, a puncturing matrix may be employed according to the present invention, which can make the punctured convolutional code non-catastrophic.

Now, an encoder of a systematic punctured convolutional code will be described in detail.

Figure 4:
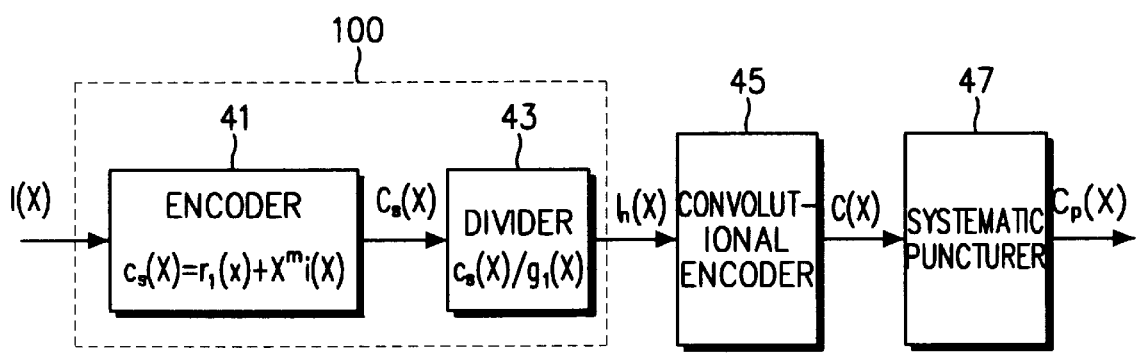
FIG. 4 is a block diagram of an encoder of a systematic punctured convolutional code according to an embodiment of the present invention.

FIG. 4 is a block diagram of one embodiment of a systematic punctured convolutional encoder according to the present invention. Assuming that the convolutional code generating polynomial employed is the previously described $g_k(x)$ (k=1, 2, ..., R) and an information word is $I_n(x)$, then a code word $C_k(x)$ (k=1, 2, ... R) generated from the encoder of FIG. 4 is expressed as:

$$C_1(x)=g_1(x)I_n(x) \quad (5)$$

$$C_k(x)=g_k(x)I_n(x) \quad (6)$$

If the first input information word is I(x), an encoder 41 generates a systematic code word $C_s(x)$ from I(x). It is to be understood that while any of R generating polynomials can be used, the performance of the systematic convolutional code word is varied depending on selection of the generating polynomial. Thus, a generating polynomial allowing the best performance for a particular application may be explored by simulation. As shown in the drawing, a divider 43, connected to encoder 41, selects a generating polynomial $g_1(x)$.

Figure 5A:
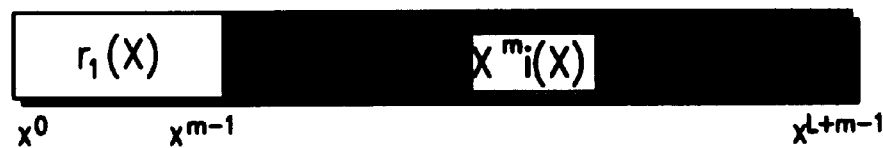
FIGS. 5A, 5B, and 5C illustrate the bit structures of code words.
Figure 5B:
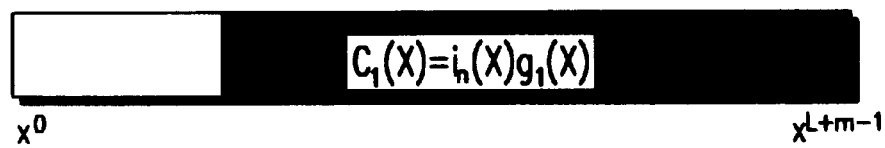
Figure 5C:
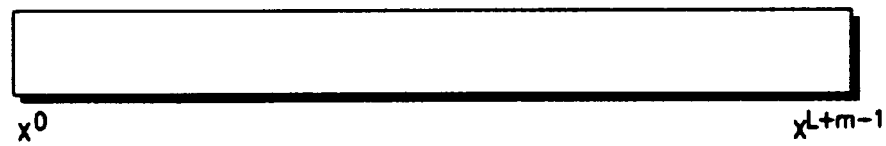

It is to be appreciated that the systematic code word $C_s(x)$ is converted to the new information word $I_n(x)$ in the divider 43. This information word, generated via the operations of block 100 (encoder 41 and divider 43) and resulting in non-systematic code words, is input to a conventional convolutional encoder 45. Thus, a convolutional code word generated from the new information word $I_n(x)$ is non-systematic. However, as is noted from comparison between the code word and the first input information word I(x), a code word generated from the convolutional encoder 45 is always systematic, if the generating polynomial $g_k(x)$ is employed in the systematic code encoder 41. For example, by use of $g_2(x)$, the first input information word I(x) exists in $C_2(x)$ in a systematic form as shown in the following equation:

$$C_2=r_2(x)+x^m I(x)$$
$$=I_n(x)g_2(x)$$
$$=C_s(x) \quad (7)$$

where $r_2(x)$ is a remnant produced from dividing $x^m I(x)$ by $g_2(x)$ and m is the number of shifters. Therefore, the code word C(x) is a systematic convolutional code. FIGS. 5A, 5B, and 5C illustrate the bit structures of code words, respectively, for $C_s(x)$, $C_1(x)$, and $C_i(x)$.

Next, code word C(x) is provided to a systematic puncturer 47. Selection of a puncturing matrix employed by the systematic puncturer 47 will now be described.

The systematic puncturer 47 periodically punctures symbols of C(x). In this embodiment, a puncturing matrix A is represented as [R×P]. When an element of this matrix is 0, a corresponding symbol is punctured (i.e., deleted) and not transmitted. For generation of a systematic code word, the puncturing matrix should satisfy the following conditions:

(1) all elements in one of the row vectors are 1s in the puncturing matrix A;

(2) a convolutional code word generated by use of the puncturing matrix A should be non-catastrophic; and (3) the convolutional code generated by use of the puncturing matrix A should have the largest value of minimum free distance (d-free) and a minimum information word error after decoding.

The systematic puncturer 47 then punctures the C(x) in accordance with the selected puncturing matrix to generate $C_p(x)$ for transmission over a channel to a decoder.

Examples of preferred puncturing matrices and corresponding weight spectra are listed below in Table I.

TABLE I

| | input information | | | |
|---|---|---|---|---|
| constraint length (k) | first generating polynomial ($G_1$) | second generating polynomial ($G_2$) | d-free | puncturing matrix |
| 3 | 101 | 111 | 5 | $\begin{bmatrix} 1 & 0 \\ 1 & 1 \end{bmatrix}$ |
| 4 | 1101 | 1111 | 6 | $\begin{bmatrix} 1 & 1 \\ 0 & 1 \end{bmatrix}$ |
| 5 | 10011 | 11101 | 7 | $\begin{bmatrix} 1 & 1 \\ 0 & 1 \end{bmatrix}$ |
| 6 | 101011 | 111101 | 8 | $\begin{bmatrix} 1 & 0 \\ 1 & 1 \end{bmatrix}$ |
| 7 | 1011011 | 1111001 | 10 | $\begin{bmatrix} 1 & 1 \\ 0 & 1 \end{bmatrix}$ |

Figure 6:
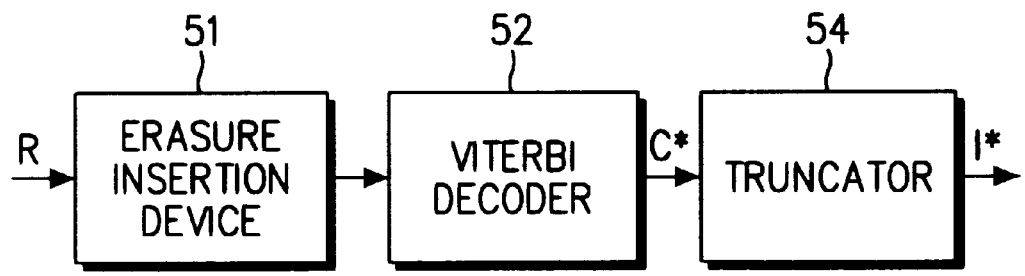
FIG. 6 is a block diagram of a decoder of a systematic punctured convolutional code according to an embodiment of the present invention.

Referring now to FIG. 6, the operation of a decoder of a systematic punctured convolutional code according to the invention will be described.

As described referring to FIG. 4, though C(x) is a non-systematic code, one of R code words in the code is a systematic code word, i.e., $C_k(x)$ corresponding to $g_k(x)$ used for generating a systematic code in the encoder. The decoder of a systematic punctured convolutional code includes an erasure insertion device 51, or depuncturer, which inserts an erasure bit in the location of a code word punctured by the systematic puncturer 47 of FIG. 4. Then, a Viterbi decoder 52 decodes the erasure bit-inserted code word by the well-known Viterbi method and selects $C_s$ from decoded code words. A truncator 54 separates symbols corresponding to the information code I(x) from the symbols of the code word according to equation (7) above.

The systematic punctured convolutional code of the present invention exhibits an excellent performance at a high rate, as compared to that used in a Viterbi chip of Qualcomm. In other words, because the performance difference between a non-systematic convolutional code and a systematic convolutional code increases with a higher rate, the systematic convolution code can be advantageously used for high speed transmission, a high rate coding scheme, and CDMA PCS (Personal Communication System) or FPLMTS (Future Public Land Mobile Telecommunication System) for data transmission, that is, packet transmission.

FIG. 7 is a table showing weight spectra of rate-2/3 systematic punctured convolutional codes generated from a known code with a code rate of 1/2, $3 \leq K \leq 7$, a puncturing period (P) of 2, and FIG. 8 is a table showing weight spectra of systematic punctured convolutional codes generated from a known code with a code rate of 1/2, K of 7, $G_1$=[1011011], and $G_2$=[1111001].

As described above, the present invention is advantageous in that an information word is directly obtained from received code words without passing through a decoder and thus it can be determined in a short time whether the received code words should be decoded. Though the performances of known systematic convolutional and punctured convolutional codes are considered as inferior to those of known non-systematic convolutional and punctured convolutional codes, the systematic convolutional and punctured convolutional codes of the present invention have the same code weight spectra as those of non-systematic ones and exhibit performances equal to or better at a high rate than the non-systematic ones.

While the present invention has been described in detail with reference to the specific embodiment of the present invention, it is a mere exemplary application. Thus, it is to be clearly understood that many variations can be made by anyone skilled in the art within the scope and spirit of the present invention.

What is claimed is:

1. A method of rate-1/2 convolutional encoding in a digital communications system, comprising the steps of:

obtaining first and second block code words by multiplying an input information word by first and second convolutional code generating polynomials, respectively; and generating a convolutional code word by interleaving the first and second code words with an interleaving depth ($\lambda$) of n;

wherein the input information word exists in a systematic form in the second block code word $C_2(x)$ expressed as $$C_2(x) = r_2(x) + x^m I(x)$$
$$= I_n(x)g_2(x)$$
$$= C_s(x)$$

where I(x) is the input word $r_2(x)$ is a remainder after dividing $x^m I(x)$ by $g_2(x)$, m is the number of shifters, $I_n(x)$ is an information word polynomial, $g_2(x)$ is a code word generating polynomial for the second block code word, and $C_s(x)$ is a systematic code word.

2. A method of rate-1/n convolutional encoding in a digital communications system having a non-systematic convolutional encoder, comprising the steps of:

(a) obtaining first to n-th block code words by multiplying first to n convolutional code generating polynomials by an information polynomial upon input of an information word;

(b) converting one of the first to n-th block code words to a systematic code word and obtaining a new information word corresponding to the systematic code word; and (c) generating a convolutional code by encoding the new information word in the non-systematic convolutional encoder;

wherein one of the first to n-th block code words is selected and converted to the systematic code word in accordance with the following relationship:

$$C_s(x) = r_q(x) + x^m I(x)$$

where $C_s(x)$ is a code word of the sth block (s being one of 1, . . . , n), I(x) is an input information word, $r_q(x)$ is a remainder after dividing $x^m I(x)$ by $g_s(x)$, $g_s(x)$ being an sth code word generating polynomial, and m is the number of shifters.

3. A method of rate-k/n convolutional encoding in a digital communications system having a non-systematic convolutional encoder, comprising the steps of:

obtaining first to n-th block code words by multiplying first to n convolutional code generating polynomials by an information polynomial upon input of an information word;

converting one of the first to n-th block code words to a systematic code word and obtaining a new information word corresponding to the systematic code word;

generating a convolutional code by encoding the new information word in the non-systematic convolutional encoder; and systematically puncturing the convolutional code by use of a predetermined puncturing matrix;

wherein all elements in a row vector of the predetermined puncturing matrix are 1s.

4. The method of claim 3, wherein a convolutional code generated according to the predetermined puncturing matrix is non-catastrophic.

5. The method of claim 4, wherein the generated convolutional code according to the predetermined puncturing matrix has a largest value of minimum free distance (d-free) and a minimum information code error after decoding.

6. The method of claim 5, wherein the puncturing matrix is selected from given matrices according to a corresponding code rate, and the convolutional code is punctured according to a weight spectrum corresponding to the selected puncturing matrix.

7. The method of claim 6, wherein the given puncturing matrix and corresponding weight spectrum are selected from one of a following puncturing matrices:

$$\begin{bmatrix} 1 & 0 \\ 1 & 1 \end{bmatrix}$$

where a constraint length (k) is 3, a first generating polynomial ($G_1$) is 101, a second generating polynomial ($G_2$) is 111, and d-free is 5;

$$\begin{bmatrix} 1 & 1 \\ 0 & 1 \end{bmatrix}$$

where a constraint length (k) is 4, a first generating polynomial ($G_1$) is 1101, a second generating polynomial ($G_2$) is 1111, and d-free is 6;

$$\begin{bmatrix} 1 & 1 \\ 0 & 1 \end{bmatrix}$$

where a constraint length (k) is 5, a first generating polynomial ($G_1$) is 10011, a second generating polynomial ($G_2$) is 11101, and d-free is 7;

$$\begin{bmatrix} 1 & 0 \\ 1 & 1 \end{bmatrix}$$

where a constraint length (k) is 6, a first generating polynomial ($G_1$) is 101011, a second generating polynomial ($G_2$) is 111101, and d-free is 8; and $$\begin{bmatrix} 1 & 1 \\ 1 & 0 \end{bmatrix}$$

where a constraint length (k) is 7, a first generating polynomial ($G_1$) is 1011011, a second generating polynomial ($G_2$) is 1111001, and d-free is 10

| | input information | | | |
|---|---|---|---|---|
| constraint length (k) | first generating polynomial ($G_1$) | second generating polynomial ($G_2$) | d-free | puncturing matrix |
| 3 | 101 | 111 | 5 | $\begin{bmatrix} 1 & 0 \\ 1 & 1 \end{bmatrix}$ |
| 4 | 1101 | 1111 | 6 | $\begin{bmatrix} 1 & 1 \\ 0 & 1 \end{bmatrix}$ |
| 5 | 10011 | 11101 | 7 | $\begin{bmatrix} 1 & 1 \\ 0 & 1 \end{bmatrix}$ |
| 6 | 101011 | 111101 | 8 | $\begin{bmatrix} 1 & 0 \\ 1 & 1 \end{bmatrix}$ |
| 7 | 1011011 | 1111001 | 10 | $\begin{bmatrix} 1 & 1 \\ 0 & 1 \end{bmatrix}$ |

8. A rate-1/2 convolutional encoding system for a digital communication system, comprising:

means for obtaining first and second block code words by multiplying an input information word by first and second convolutional code generating polynomials, respectively; and means for generating a convolutional code word by interleaving the first and second code words with an interleaving depth ($\lambda$) of n;

wherein the input information word exists in a systematic form in the second block code word $C_2(x)$ expressed as $$C_2(x) = r_2(x) + x^m I(x)$$
$$= I_n(x) g_2(x)$$
$$= C_s(x)$$

where I(x) is the input word, $r_2(x)$ is a remainder after dividing $x^m I(x)$ by $g_2(x)$, m is the number of shifters, $I_n(x)$ is an information word polynomial, $g_2(x)$ is a code word generating polynomial for the second block code word, and $C_s(x)$ is a systematic code word.

9. A rate-1/n convolutional encoding system for a digital communication system having a non-systematic convolutional encoder, comprising:

(a) means for obtaining first to n-th block code words by multiplying first to n convolutional code generating polynomials by an information polynomial upon input of an information word;

(b) means for converting one of the first to n-th block code words to a systematic code word and obtaining a new information word, $I_n(x)$, corresponding to the systematic code word; and (c) means for generating a convolutional code by encoding the new information code in the non-systematic convolutional encoder;

wherein one of the first to n-th block code words is selected and converted to the systematic code word using equation (1), and the new information word corresponding to the systematic code word is obtained using equation (2), in the converting means (b):

$$C_s(x)=r_q(x)+x^m I(x) \quad (1)$$

$$I_n(x)=C_s(x)/g_s(x) \quad (2)$$

where $C_s(x)$ is a code word of the sth block (s being one of 1, . . . , n), I(x) is an input information word, $r_q(x)$ is a remainder after dividing $x^m I(x)$ by $g_s(x)$, $g_s(x)$ being an sth code word generating polynomial, and m is the number of shifters.

10. A rate-k/n convolutional encoding system for a digital communication system having a non-systematic convolutional encoder, comprising:

means for obtaining first to n-th block code words by multiplying first to n convolutional code generating polynomials by an information polynomial upon input of an information word;

means for converting one of the first to n-th block code words to a systematic code word and obtaining a new information word corresponding to the systematic code word;

means for generating a convolutional code by encoding the new information code in the non-systematic convolutional encoder; and means for systematically puncturing the convolutional code using a predetermined puncturing matrix wherein the predetermined puncturing matrix satisfies the condition that all elements of one row vector are 1s.

11. A system as claimed in claim 10, wherein the predetermined puncturing matrix further satisfies the following conditions:

a convolutional code generated is non-catastrophic; and the generated convolutional code has the largest value of minimum free distance (d-free) and a minimum information code error after decoding.

12. A system as claimed in claim 11, wherein the puncturing matrix is selected from given matrices according to a corresponding code rate, and the convolutional code is punctured according to a weight spectrum corresponding to the selected puncturing matrix.

13. A method of rate-k/n convolutional encoding in a digital communications system having a non-systematic convolutional encoder, comprising the steps of:

obtaining first to n-th block code words by multiplying first to n convolutional code generating polynomials by an information polynomial upon input of an information word;

converting one of the first to n-th block code words to a systematic code word and obtaining a new information word corresponding to the systematic code word; and generating a convolutional code by encoding the new information word in the non-systematic convolutional encoder;

wherein one of the first to n-th block code words is selected and converted to the systematic code word in accordance with the following relationship:

$$C_s(x)=r_q(x)+x^m I(x)$$

where $C_s(x)$ is a code word of the sth block (s being one of 1, . . . , n), I(x) is an input information word, $r_q(x)$ is a remainder after dividing $x^m I(x)$ by $g_s(x)$, $g_s(x)$ being an sth code word generating polynomial, and m is the number of shifters.

14. A rate-k/n convolutional encoding system for a digital communication system having a non-systematic convolutional encoder, comprising:

(a) means for obtaining first to n-th block code words by multiplying first to n convolutional code generating polynomials by an information polynomial upon input of an information word;

(b) means for converting one of the first to n-th block code words to a systematic code word and obtaining a new information word, $I_n(x)$, corresponding to the systematic code word; and (c) means for generating a convolutional code by encoding the new information code in the non-systematic convolutional encoder;

wherein one of the first to n-th block code words is selected and converted to the systematic code word using equation (1), and the new information word corresponding to the systematic code word is obtained using equation (2), in the converting means (b):

$$C_s(x)=r_q(x)+x^m I(x) \quad (1)$$

$$I_n(x)=C_s(x)/g_s(x) \quad (2)$$

where $C_s(x)$ is a code word of the sth block (s being one of 1, . . . , n), I(x) is an input information word, $r_q(x)$ is a remainder after dividing $x^m I(x)$ by $g_s(x)$, $g_s(x)$ being an sth code word generating polynomial, and m is the number of shifters.

* * * * *